United States Patent
Lange et al.

(10) Patent No.: US 7,578,422 B2
(45) Date of Patent: Aug. 25, 2009

(54) BOND CAPILLARY DESIGN FOR RIBBON WIRE BONDING

(75) Inventors: Bernhard P. Lange, Garland, TX (US); Steven A. Kummerl, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 84 days.

(21) Appl. No.: 11/733,870

(22) Filed: Apr. 11, 2007

(65) Prior Publication Data

US 2007/0181652 A1   Aug. 9, 2007

Related U.S. Application Data

(62) Division of application No. 11/148,687, filed on Jun. 9, 2005, now Pat. No. 7,216,794.

(51) Int. Cl.
*B23K 1/06*   (2006.01)
(52) U.S. Cl. .......................... 228/1.1; 228/4.5
(58) Field of Classification Search .................. None
See application file for complete search history.

(56) References Cited

U.S. PATENT DOCUMENTS

| | | | | |
|---|---|---|---|---|
| 4,619,397 | A * | 10/1986 | Urban | 228/111 |
| 4,771,930 | A * | 9/1988 | Gillotti et al. | 228/102 |
| 4,976,392 | A | 12/1990 | Smith et al. | |
| 5,018,658 | A * | 5/1991 | Farassat | 228/4.5 |
| 5,148,959 | A | 9/1992 | Cain et al. | |
| 5,400,503 | A * | 3/1995 | Komoriya et al. | 29/850 |
| 5,445,306 | A | 8/1995 | Huddleston | |
| 5,452,838 | A | 9/1995 | Farassat | |
| 5,452,841 | A | 9/1995 | Sibata et al. | |
| 5,616,520 | A | 4/1997 | Nishiuma et al. | |
| 5,868,300 | A | 2/1999 | Babayan | |
| 5,894,981 | A | 4/1999 | Kelly | |
| 5,906,706 | A | 5/1999 | Farassat | |
| 6,155,474 | A | 12/2000 | Orcutt | |
| 6,173,879 | B1 | 1/2001 | Chiba | |
| 6,271,601 | B1 * | 8/2001 | Yamamoto et al. | 257/784 |

(Continued)

FOREIGN PATENT DOCUMENTS

GB   2177639   7/1985

*Primary Examiner*—Kiley Stoner
(74) *Attorney, Agent, or Firm*—Yingsheng Tung; Wade J. Brady, III; Frederick J. Telecky, Jr.

(57) ABSTRACT

A device (100) and method (200) for bonding a ribbon wire (104) to a workpiece (106) comprising feeding the ribbon wire through a passageway (116) of an ultrasonic bond capillary (102) and clamping the ribbon wire against an engagement surface (120) of the bond capillary via a clamping jaw (118) operably coupled to the bond capillary. The ribbon wire (104) is bonded to the workpiece (106) along a bonding surface (112) of the bond capillary (102) and penetrated, at least partially, between the bonding surface and the engagement surface (120) of the bond capillary by a cutting tool (124). The cutting tool (124) may comprise an elongate member (126) positioned between the bonding surface (112) and engagement surface (120), and may have a cutting blade (128) positioned at a distal end (130) thereof. The cutting tool (124) may further comprise a ring cutter (132), wherein the ribbon wire passes through a ring (134) having a cutting surface (138) defined about an inner diameter thereof.

10 Claims, 4 Drawing Sheets

U.S. PATENT DOCUMENTS

| | | | |
|---|---|---|---|
| 6,276,588 B1 * | 8/2001 | Johnson | 228/13 |
| 6,311,890 B1 | 11/2001 | Chapman et al. | |
| 6,439,448 B1 * | 8/2002 | Ringler | 228/110.1 |
| 6,595,400 B2 | 7/2003 | Terakado et al. | |
| 6,667,625 B1 * | 12/2003 | Miller | 324/525 |
| 6,715,659 B2 | 4/2004 | Ball | |
| 6,786,392 B2 | 9/2004 | Nogawa | |
| 6,800,555 B2 | 10/2004 | Test et al. | |
| 6,827,248 B2 * | 12/2004 | Farassat | 228/4.5 |
| 6,845,898 B2 | 1/2005 | Ball et al. | |
| 7,407,079 B2 * | 8/2008 | Copperthite et al. | 228/4.5 |
| 2004/0188499 A1 | 9/2004 | Nosaka | |
| 2005/0223858 A1 * | 10/2005 | Lu et al. | 82/173 |
| 2006/0016860 A1 * | 1/2006 | Kampschreur et al. | 228/180.5 |

* cited by examiner

BOND CAPILLARY DESIGN FOR RIBBON WIRE BONDING

CROSS REFERENCE TO RELATED APPLICATIONS

This application is a division of Ser. No. 11/148,687, filed Jun. 9, 2005, now U.S. Pat. No. 7,216,794 the contents of which are herein incorporated by referenced in its entirety.

FIELD OF THE INVENTION

The present invention relates generally to semiconductor devices and processes, and more particularly to device and method for bonding a ribbon wire to a workpiece.

BACKGROUND OF THE INVENTION

In the semiconductor industry, wire bonding is commonly performed to electrically interconnect an integrated circuit (IC), such as a semiconductor die or chip, to various structures, such as a metal leadframe. Wedge bonding, for example, is a conventional method used to bond thin wires, such as thin aluminum or gold wire, between a bonding point on the semiconductor die to another point, such as a lead finger of the leadframe. Conventionally, in order to initiate a bond, the wire is pressed against the IC and/or leadframe with a tip of a bonding tool. The bonding tool is ultrasonically vibrated for a period of tens of milliseconds, wherein a plane of motion of the tip of the bonding tool is generally parallel to the surface of the semiconductor chip to which the bond is to be formed. The combination of a static load of the bonding tool normal to the chip's surface against the wire and chip coupled with the vibration at the tip of the tool causes the wire to plastically deform, thus simultaneously joining the bond wire with atoms of the material composing the chip's or leadframe's surface, and accordingly, providing a cold weld between the wire and the chip or leadframe.

One problem associated with wire bonding is the handling of the wire throughout the bonding process, and the breaking or severing of the wire after the bond has been made. To perform these functions, most conventional fine wire wedge bonding tools break the wire by clamping and/or pulling the wire away from the bonded substrate. Typically, with small diameter wires (circular cross-section wires having diameters of less than 0.025 inches), such a pulling action is sufficient, and does not cause significant damage to the substrate. However, with the ever-increasing demands for speed and performance of ICs, ribbon wires have been introduced, wherein a cross-sectional area of the ribbon wires is significantly greater than previously-used round cross-section wires, thus providing greater electrical current-carrying capabilities for the wire. Accordingly, when the conventional bonding tools are used with the thicker ribbon wires, the pulling force required to break the ribbon wire tends to deleteriously deform the chip and/or leadframe. As a consequence, various configurations for bonding tools have been formulated, such as one wherein a blade is pressed against the chip and/or leadframe in order to deform or cut the ribbon wire prior to pulling the bonding tool away from the substrate.

FIGS. 1A-1C illustrate one such conventional bonding device 10 during various operations, wherein a ribbon wire 15 is bonded to a substrate 20, such as a leadframe finger or semiconductor chip by an ultrasonic bonding tool 25. As illustrated in FIG. 1A, the bonding tool 25 is pressed against the ribbon wire 15, thus compressing the ribbon wire between the bonding tool and the substrate 20. At this point, the bonding tool 25 ultrasonically vibrates, thus cold-welding the ribbon wire 15 to the substrate 20. FIG. 1B illustrates a cutter 30 that is pressed against the ribbon wire 15, wherein the cutter significantly thins or cuts through the ribbon wire by the force F exerted by the cutter. FIG. 1C illustrates the bonding tool 25 being pulled away from the substrate 20, wherein a clamp 35 further pulls the ribbon wire 15 from the substrate, thus fully severing the ribbon wire generally at a tip 40 of the cutter 30.

One problem with the conventional bonding of ribbon wires, however, is that the force F of the cutter 30 against the ribbon wire 15 illustrated in FIG. 1B typically translates into a force on the substrate 20, wherein the substrate is potentially permanently deforming and/or damaged by the cutting operation. For example, as in the case of the ribbon wire 15 being bonded to a thin leadframe finger, the force F significantly deforms the leadframe finger (as illustrated by arrow 45), wherein the deformation remains after the cutter is pulled away from the substrate 20. Furthermore, if the ribbon wire 15 is not completely severed, the pulling force may further bend the leadframe finger in a direction opposite of the arrow 45 when the clamp 35 pulls the ribbon wire away. Alternatively, as in the case of the ribbon wire 15 being bonded to a chip, the cutting force F can deleteriously impact the chip, such as potentially damaging metallization layers or other layers of the IC.

Therefore, a need currently exists for a reliable process and apparatus for bonding ribbon wires to substrates, wherein damage to the substrate is substantially minimized.

SUMMARY OF THE INVENTION

The present invention overcomes the limitations of the prior art by providing an improved device and method for bonding wires to various substrates. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward an improved device and method for bonding a ribbon wire to a workpiece. According to one exemplary aspect of the invention, the device comprises an ultrasonic bond capillary having a body region and a bonding region, wherein the body region comprises a passageway defined therein. The ribbon wire generally extends through the passageway and along a bonding surface associated with the bonding region, and a clamping jaw is operably coupled to the ultrasonic bond capillary in the vicinity of the passageway. Accordingly, the clamping jaw is operable to selectively grip the ribbon wire between an engagement surface of the passageway and a clamping surface of the clamping jaw.

A cutting tool is further operably coupled to the ultrasonic bond capillary and generally positioned between the bonding surface and the engagement surface of the bond capillary. The cutting tool, for example, is operable to selectively extend and retract with respect to the ultrasonic bond capillary, wherein the cutting tool can at least partially penetrate through the ribbon wire positioned between the bonding surface and engagement surface of the ultrasonic bond capillary. Such a penetration of the ribbon wire between the bonding surface and the engagement surface while the ribbon wire is substantially clamped with respect to the bond capillary is highly advantageous over the prior art, since the cutting action of the cutting tool does not press on the workpiece, but rather, cuts the ribbon wire between two generally fixed and/or clamped regions.

In accordance with another exemplary aspect of the invention, one or more of the clamping jaw and cutting tool are operably coupled to the bond capillary by one or more actuators, such as electromechanical actuators. The electromechanical actuators may comprise one or more of a servo motor, linear motor, spring actuator, pneumatic, and hydraulic actuators operable to selectively extend and retract the respective clamping jaw and cutting tool with respect to the ultrasonic bond capillary. The cutting actuator, for example, may comprise a spring operable to extend the cutting tool with respect to the ultrasonic bond capillary, while a magnetic or electromagnetic actuator retracts the cutting tool, or vice-versa.

According to another example, the cutting tool comprises an elongate member having a cutter blade generally defined at a distal end thereof. The cutting tool may further comprise a ring cutter having an inner region defined at the distal end of the elongate member, wherein the ribbon wire generally passes through the inner region of the ring, and wherein the cutting blade is generally defined by a cutting surface about an inner diameter of the ring. The ring cutter is then operable to selectively penetrate or sever the ribbon wire upon retraction of the cutter ring toward the bond capillary.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
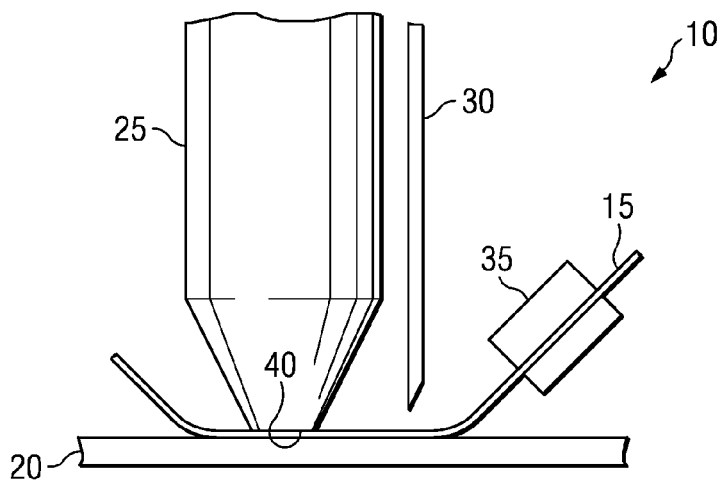
FIGS. 1A-1C illustrate a conventional bonding device in various positions during bonding.
Figure 1B:
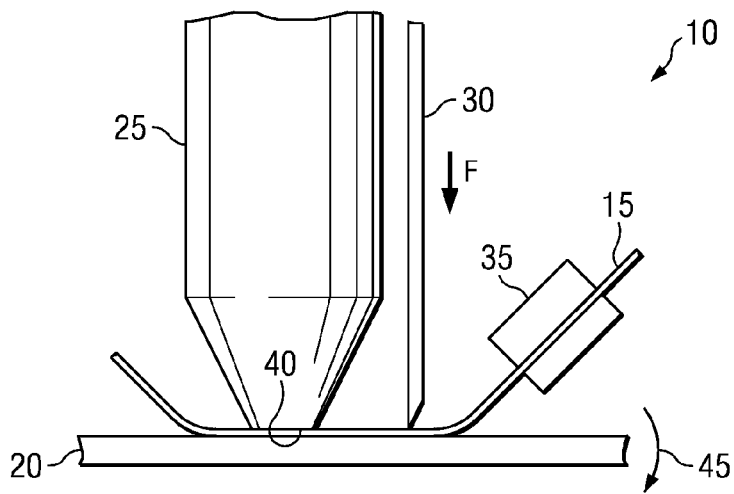
Figure 1C:
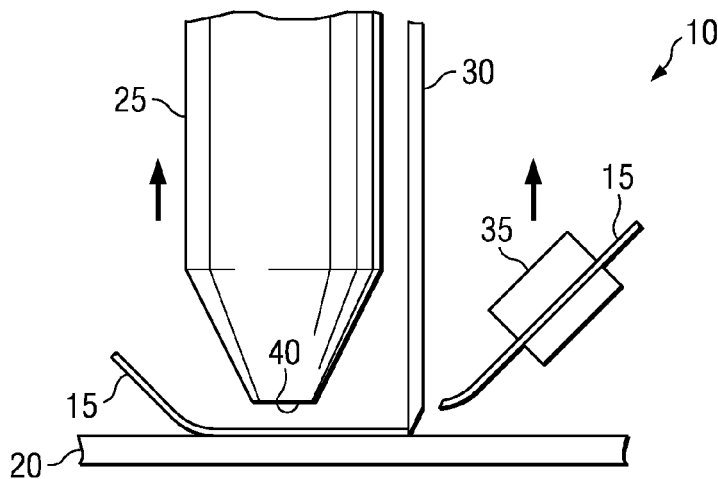

The present invention is directed towards an apparatus and method for bonding a wire to substrate or workpiece, such as an integrated circuit (IC) and/or leadframe assembly. More particularly, the present invention provides a robust and reliable device and process for bonding a rectangular cross-section ribbon wire to the substrate, wherein damages or deformations to the substrate seen in conventional bonding apparatuses and processes are substantially mitigated. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
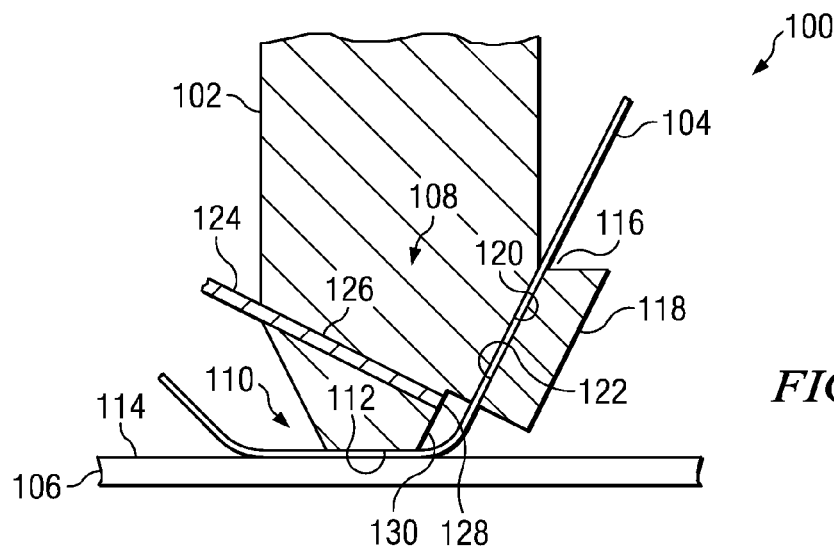
FIG. 2 illustrates a partial cross-sectional view of an exemplary bonding device according to one aspect of the present invention.

Referring now to the figures, FIG. 2 illustrates a partial cross-sectional view of an exemplary bonding device 100, wherein one or more exemplary aspects of the present invention will now be discussed. The bonding device 100, in accordance with one exemplary aspect of the present invention, comprises an ultrasonic bond capillary 102 for ultrasonically bonding a ribbon wire 104 to a substrate or workpiece 106, such as one or more of an IC chip or a leadframe. The ultrasonic bond capillary 102, for example, is operably coupled to an ultrasonic oscillator (not shown), as is known in the art for providing an ultrasonic vibration to the bond capillary. The ultrasonic bond capillary 102 comprises a body region 108 and a bonding region 110, wherein the ultrasonic bond capillary is operable to sandwich the ribbon wire 104 between a bonding surface 112 of the ultrasonic bond capillary and a surface 114 of the workpiece 106. The body region 108 of the bond capillary 102, for example, comprises a passageway 116 defined therein, wherein the ribbon wire 104 further generally extends through the passageway and along the bonding surface 114 associated with the bonding region 110. The passageway 116 may be comprised of a thru-hole, a channel, or various other surfaces (not shown) defined within or along the body region 108, wherein the ribbon wire 104 is operable to extend along the passageway. In one example, the ribbon wire 104 is generally rectangular in cross-section, wherein the passageway is also generally rectangular in cross-section.

FIG. 2 further illustrates a clamping jaw 118 operably coupled to the bond capillary 102 in the body region 110 thereof, wherein the clamping jaw is further associated with the passageway 116. The clamping jaw 118 is operable to selectively grip the ribbon wire 104 between an engagement surface 120 of the passageway 116 of the bond capillary 102 and a clamping surface 122 of the clamping jaw 118. In the present example, the engagement surface 120 of passageway 116 is generally planar, wherein the passageway is generally defined between the body region 110 of the bond capillary 102 and the clamping surface 122 of the clamping jaw 118. Alternatively, the passageway 116 may be defined by a channel (not shown) or other structure associated with the body region 110 of the bond capillary 102, wherein the clamping jaw 118 is operable to substantially grip or prevent movement of the ribbon wire 104 within the passageway.

The clamping jaw 118 of the present invention may be operably coupled to an electro-mechanical actuator (not shown), wherein the electro-mechanical actuator is operable to retract and/or extend the clamping jaw, thus respectively gripping and/or releasing the ribbon wire 104. For example, the clamping jaw 118 may be operably coupled to a motor (not shown), such as a servo motor, wherein the motor is operable to selectively extend and retract the clamping jaw with respect to the engagement surface 120. The clamping jaw 118 may be further coupled to one or more springs (not shown), wherein the one or more springs are further operable to substantially extend or retract the clamping jaw with respect to the engagement surface 120. Alternatively, the clamping jaw 118 may be operably coupled to a pneumatic or hydraulic actuator (not shown), wherein the pneumatic or hydraulic actuator is operable to extend and retract the clamping jaw with respect to the engagement surface 120. Accordingly, any actuator operable to extend and/or retract the clamping jaw 118 with respect to the engagement surface 120 of the bond capillary 102 is contemplated as falling within the scope of the present invention. It should also be noted that the clamping jaw is generally integrated with the bond capillary 102, wherein the engagement surface 120 of the bond capillary 102 is generally near the bonding surface 114, as will be discussed hereafter.

According to another exemplary aspect of the present invention, the bonding device 100 further comprises a cutting tool 124, wherein the cutting tool is further operably coupled to the bond capillary 102. The cutting tool 124, for example, is generally positioned between the bonding surface 114 and the engagement surface 120 of the bond capillary 102, wherein the cutting tool is operable to selectively extend and retract with respect to the bond capillary. The cutting tool 124, for example, comprises an elongate member 126, wherein a cutting blade 128 is generally defined at a distal end 130 thereof. The cutting blade 128, for example, may be flattened, as illustrated in FIG. 2, or may alternatively converge to a point (not shown) at the distal end 130 of the cutting tool. According to the invention, the cutting tool 124 is operable to penetrate, at least partially, through the ribbon wire 104 between the bonding surface 114 and engagement surface 120 of the ultrasonic bond capillary 102 when the cutting blade 128 is extended past the clamping surface 122 of the clamping jaw 118 in a shear-like manner.

Figure 3:
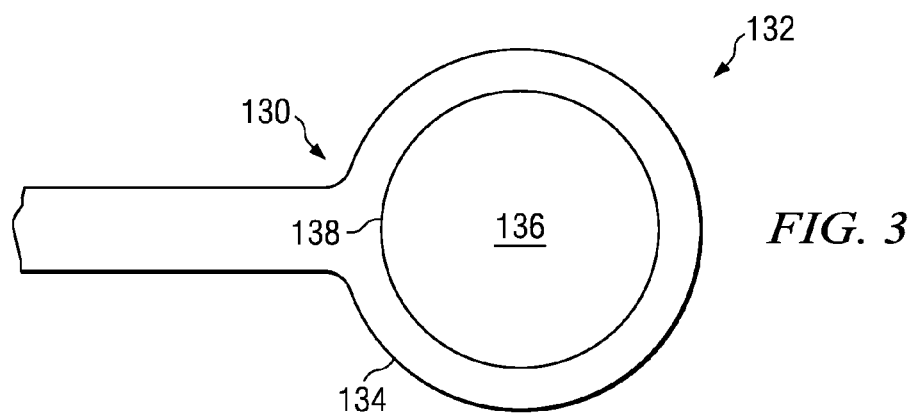
FIG. 3 illustrates a plan view of a ring cutter according to another exemplary aspect of the present invention.

In another example, the cutting tool 124 comprises a ring cutter 132, as illustrated in FIG. 3. The ring cutter 132, for example, comprises a ring 134 positioned at the distal end 130 of the cutting tool 124 of FIG. 2, wherein the ribbon wire 104 generally passes through an inner region 136 of the ring. The ring cutter 132 of FIG. 3 is operable to selectively extend and retract in a manner similar to the cutting blade 128 of FIG. 2, however, a cutting surface 138 of the ring cutter is operable to generally pass through the ribbon wire when being retracted towards the body region 110 of the bond capillary 102. Accordingly, the ring cutter of FIG. 3 is operable to be drawn against the engagement surface 120 of the bond capillary, thus penetrating, at least partially, through the ribbon wire 104.

In accordance with another exemplary aspect of the invention, the cutting tool 124 of FIG. 2 is operably coupled to a cutting actuator (not shown), such as an electro-mechanical actuator, servo motor, or other actuator, such as those described in reference to the clamping jaw 118. The cutting tool 124, for example, may be coupled to a magnetic actuator (not shown) and a spring (not shown), wherein the magnetic actuator is operable to retract the cutting tool (e.g., pull the distal end 130 of the cutting tool toward the body region 108 of the bond capillary 102), and wherein the spring is operable to provide a return force to the cutting tool, thus extending or returning the distal end of the cutting tool to its original position.

Figure 4:
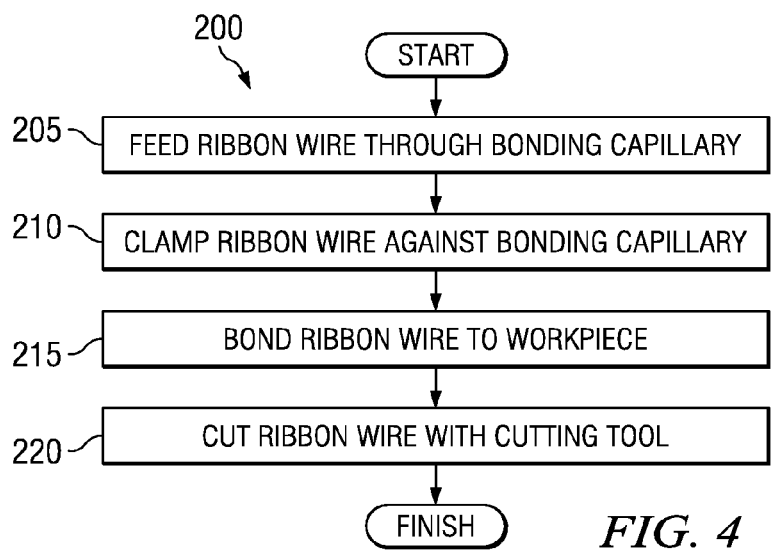
FIG. 4 is a block diagram schematic of an exemplary method for bonding a ribbon wire to a workpiece in accordance with the present invention.

According to another aspect of the present invention, FIG. 4 is a block diagram illustrating an exemplary method 200 for bonding a ribbon wire to a substrate. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 5A:
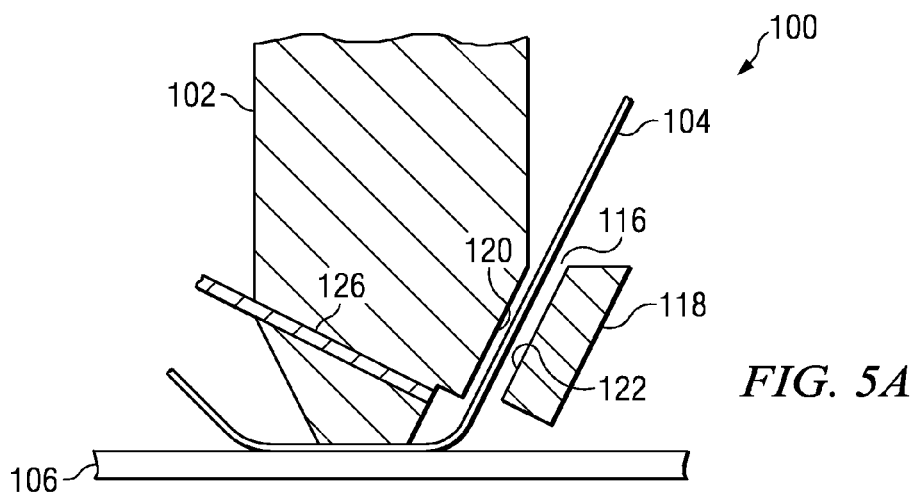
FIGS. 5A-5F illustrate partial cross-sectional views of an exemplary bonding device during various operations in accordance with another aspect of the present invention.
Figure 5B:
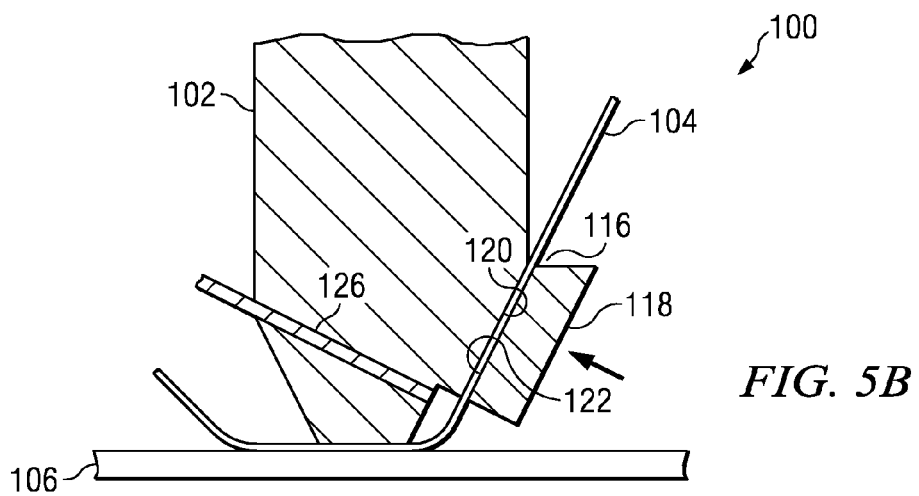

The method 200 of FIG. 4 will now be described with reference to FIGS. 5A-5F, in order to gain a more complete understanding of the present invention. As illustrated in FIG. 4, the method 200 begins with act 205, wherein a ribbon wire is fed through a bond capillary. As illustrated in FIG. 5A, the ribbon wire 104 is fed through the passageway 116 of the bond capillary 102 when the clamping jaw 118 is generally extended, thus generally permitting the advancement of the ribbon wire through the passageway. In act 210 of FIG. 4, the ribbon wire is clamped against the bond capillary, and the result of act 210 is illustrated in FIG. 5B. For example, the clamping jaw 118 generally sandwiches the ribbon wire 104 between the clamping surface 122 of the clamping jaw and the engagement surface 120 of the bond capillary 102.

Figure 5C:
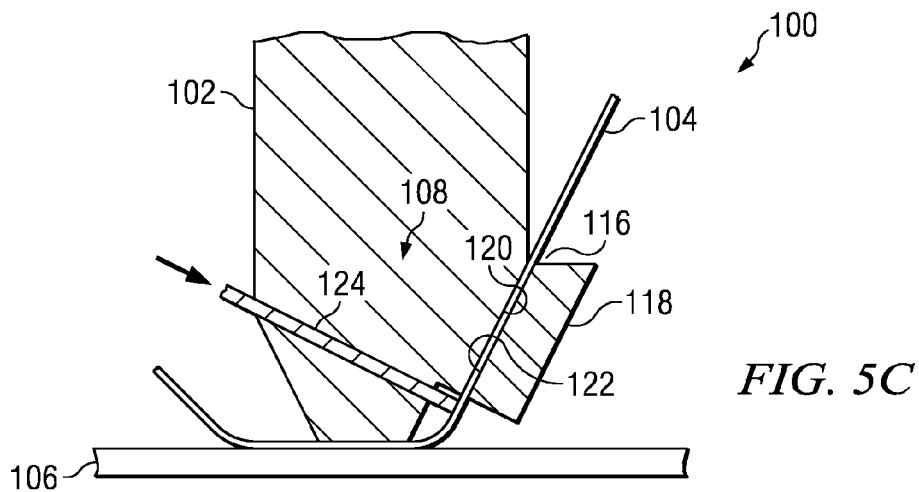
Figure 5D:
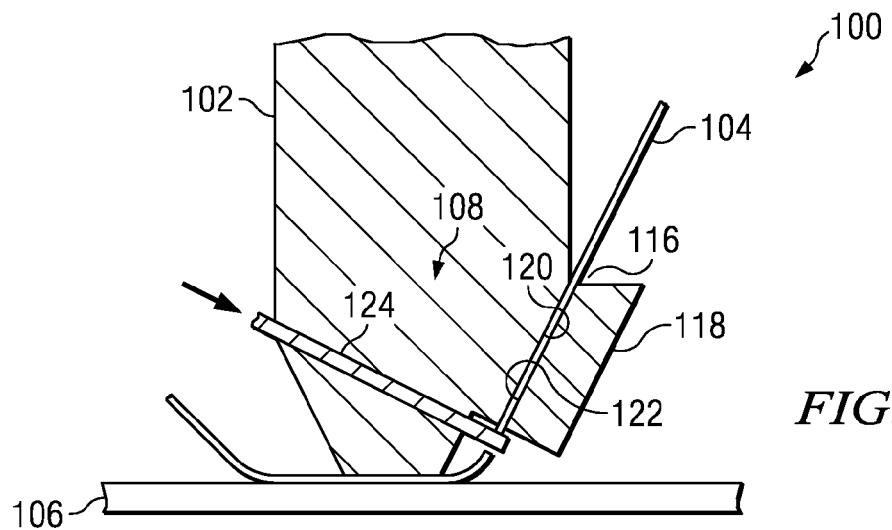
Figure 5E:
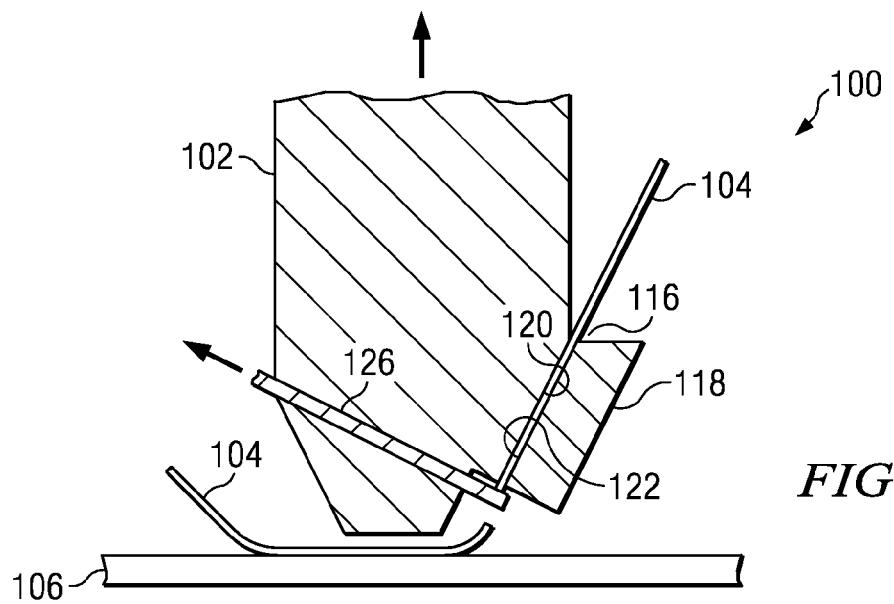
Figure 5F:
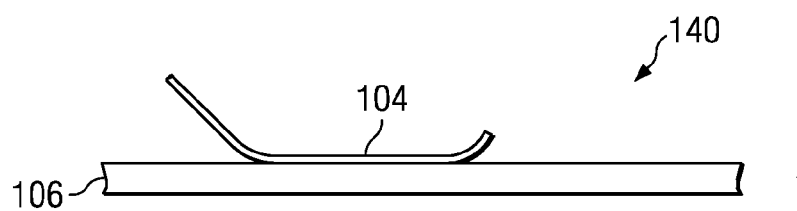

In act 215 of FIG. 4, the ribbon wire is bonded to the workpiece, such as by a cold welding the ribbon wire 104 of FIG. 5B to the workpiece 106 by ultrasonic vibration of the bond capillary 102. In one example, once the ribbon wire 104 is generally bonded to the workpiece 106, the ribbon wire can be cut by the cutting tool 124 in act 220 of FIG. 4. FIGS. 5C-5D illustrate the cutting tool 124 extending from the body region 108 of the bond capillary 102, wherein in FIG. 5D, the cutting tool 124 completely severs the ribbon wire 104. It should be noted that the ring cutter 132 of FIG. 3 may be alternatively utilized, wherein the ring cutter is retracted toward the bond capillary to cut the ribbon wire 104 of FIGS. 5A-5F. Once the cutting tool 124 at least partially penetrates through the ribbon wire 104 (illustrated as severing the ribbon wire in FIG. 5D), the bonding tool 100 can be lifted from the workpiece 106, as illustrated in FIG. 5E, thus providing a secure bond 140 of the ribbon wire to the workpiece without damaging, bending, or otherwise deleteriously affecting the workpiece, as illustrated in FIG. 5F.

Therefore, the present invention provides a device and method for bonding a ribbon wire to a workpiece, wherein the cutting or severing of the ribbon wire is performed in a manner that does not significantly deform the workpiece. By providing a cutting tool and clamping jaw that are substantially integrated with the bond capillary, no additional clamping or holding of the ribbon wire or workpiece are required, and the bonding and cutting of the ribbon wire can be performed without bending leadframe fingers or damaging surfaces of the IC chips. Furthermore, the present invention provides a bonding device that can be easily rotated between bonding positions, thus providing an efficient and reliable bonding of a ribbon wire between the bonding positions.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A device for bonding a ribbon wire to a workpiece, the device comprising:

an ultrasonic bond capillary comprising a body region and a bonding region, wherein the body region comprises a passageway defined therein, wherein the ribbon wire extends through the passageway and along a bonding surface associated with the bonding region;

a clamping jaw operably coupled to the ultrasonic bond capillary and associated with the passageway, wherein the clamping jaw is operable to selectively grip the ribbon wire between an engagement surface of the passageway and a clamping surface of the clamping jaw; and a cutting tool operably coupled to the ultrasonic bond capillary and positioned between the bonding surface and the engagement surface, wherein the cutting tool is operable to selectively extend and retract with respect to the ultrasonic bond capillary, therein at least partially penetrating through the ribbon wire between the bonding surface and engagement surface of the ultrasonic bond capillary.

2. The device of claim 1, wherein the ribbon wire has a rectangular cross section, and wherein the passageway has a rectangular cross section.

3. The device of claim 1, wherein the clamping jaw is operably coupled to a clamping actuator operable to selectively extend and retract the clamping jaw with respect to the ultrasonic bond capillary.

4. The device of claim 3, wherein the clamping actuator comprises a servo motor operably coupled to the clamping jaw.

5. The device of claim 1, wherein the ultrasonic bond capillary is coupled to an ultrasonic oscillator.

6. The device of claim 1, wherein cutting tool is operably coupled to a cutting actuator operable to selectively extend and retract the cutting tool with respect to the ultrasonic bond capillary.

7. The device of claim 6, wherein the cutting actuator comprises a servo motor coupled thereto, wherein the servo motor is operable to selectively extend and retract the cutting blade.

8. The device of claim 6, wherein the cutting actuator comprises a spring operable to extend or retract the cutting tool with respect to the ultrasonic bond capillary.

9. The device of claim 1, wherein the cutting tool comprises an elongate member having a cutter blade defined at a distal end thereof.

10. The device of claim 9, wherein the cutting tool comprises a ring having an inner region defined at the distal end of the elongate member, wherein the ribbon wire passes through the inner region of the ring, and wherein the cutting blade is defined by a cutting surface about an inner diameter of the ring.

* * * * *